(12) United States Patent
Liu

(10) Patent No.: US 6,919,585 B2
(45) Date of Patent: Jul. 19, 2005

(54) LIGHT-EMITTING DIODE WITH SILICON CARBIDE SUBSTRATE

(75) Inventor: Heng Liu, Arcadia, CA (US)

(73) Assignee: Lumei Optoelectronics, Inc., El Monte, CA (US)

(*) Notice: Subject to any disclaimer, the term of this patent is extended or adjusted under 35 U.S.C. 154(b) by 0 days.

(21) Appl. No.: 10/147,078

(22) Filed: May 17, 2002

(65) Prior Publication Data

US 2003/0214807 A1 Nov. 20, 2003

(51) Int. Cl.⁷ .............................. H01L 33/00
(52) U.S. Cl. .................. 257/97; 257/96; 257/99; 257/103
(58) Field of Search ................. 257/99, 96, 97, 257/103

(56) References Cited

U.S. PATENT DOCUMENTS

| | | | | |
|---|---|---|---|---|
| 5,063,421 A | * | 11/1991 | Suzuki et al. ................. 357/17 |
| 5,779,924 A | * | 7/1998 | Krames et al. ............... 216/24 |
| 5,786,233 A | * | 7/1998 | Taskar et al. ................ 438/46 |
| 5,834,331 A | * | 11/1998 | Razeghi ....................... 438/40 |
| 5,877,558 A | * | 3/1999 | Nakamura et al. ........... 257/749 |
| 6,133,589 A | * | 10/2000 | Krames et al. ............. 257/103 |
| 6,193,797 B1 | * | 2/2001 | Shiomi et al. ................ 117/88 |
| 6,306,675 B1 | * | 10/2001 | Tsong et al. ................. 438/47 |
| 6,429,032 B1 | * | 8/2002 | Okuyama et al. ............ 438/22 |
| 6,614,172 B2 | * | 9/2003 | Chiu et al. .................. 313/501 |

OTHER PUBLICATIONS

Lee et al., "Efficiency improvement in light–emitting diodes based on geometrically deformed chips," Light–Emitting Diodes: Research, Manufacturing, and Applications III, Proceeding of SPIE vol. 3621, 1999, pp. 237–248.*

* cited by examiner

*Primary Examiner*—Jerome Jackson
(74) *Attorney, Agent, or Firm*—Jean C. Edwards, Esq.; Dickinson Wright, PLLC

(57) ABSTRACT

A light-emitting diode is based on an undoped intrinsic SiC substrate on which are grown: an insulating buffer or nucleation structure; a light-emitting structure; window layers; a semi-transparent conductive layer; a bond pad adhesion layer; a p-type electrode bond pad; and an n-type electrode bond pad. In one embodiment, the light-emitting surface of the substrate is roughened to maximize light emission.

41 Claims, 2 Drawing Sheets

LIGHT-EMITTING DIODE WITH SILICON CARBIDE SUBSTRATE

The present invention relates to a light-emitting diode (LED) device and a method for producing and operating the same. More particularly, the present invention relates to an LED having an improved design and output characteristics. Even more particularly, the present invention relates to an LED formed on a high resistivity silicon carbide substrate with a lateral device structure.

BACKGROUND OF THE INVENTION

The efficiency of a light-emitting diode (LED) is limited by a number of factors that constitute recurring challenges for LED device engineers. Among them, generated light can be absorbed by the layers of semiconductor material that constitute the LED, and it can be occluded by the electrodes that are required to bring activation current to the active region of the device.

Silicon carbide (SiC) with relatively low resistance (i.e., highly doped) has been commonly used as a conductive substrate material for high brightness LEDs in the blue, green, and near-ultraviolet spectral range. For LEDs in this spectral range, Gallium nitride (GaN) has been used as a basic light-emitting material. GaN-based LED structures are normally grown on the substrate, layer by layer, through vapor deposition processing, which is generally a metal-organic chemical vapor deposition process (MOCVD).

FIG. 1 depicts a schematic diagram of a conventional LED device 10, or an LED chip, built on a substantially conductive SiC substrate 20. Two electrodes 21, 22, serving as ohmic contacts, are disposed at opposite sides of the substrate 20. One of the electrodes 21, which is referred to herein as the top electrode 21, is positioned at the side of the substrate 20 upon which the LED is built (i.e., the MOCVD or epitaxial layer side). The other electrode 22 is referred to herein as the bottom electrode 22 and is positioned at the side of the substrate 20 opposite the epitaxial layer side. A buffer layer 23 is disposed on the SiC substrate 20, and a light-emitting structure 24 is disposed on the buffer layer. The light-emitting structure 24 includes an active region 26 flanked by an n-type cladding layer 25 and a p-type cladding layer 27.

There are performance issues associated with this device design. To grow high quality GaN material on SiC substrate a 3% lattice mismatch needs to be considered. Lattice mismatches induce strain in the crystal structure that leads to performance limiting crystal structure defects or degrades electronic device reliability.

Usually, an aluminum nitride (AlN) layer with only 1% lattice mismatch to the SiC is used as a transition layer between SiC and GaN. Since AlN is highly resistive, LEDs made with an AlN transition layer exhibit very high forward voltage that results in high power consumption and low efficiency.

In order to reduce the resistivity of the transition layer, an aluminum-gallium-nitride (AlGaN) layer can be employed. AlGaN can be doped n-type and create much higher conductivity than AlN. However, since the lattice mismatch issue must be addressed, the AlGaN compound used still requires a high aluminum (Al) composition. This results in a limited improvement of the forward voltage.

A second issue is that in order to form a low resistance current flow path from the top electrode to the bottom electrode during device operation, the SiC substrate is required to be highly doped. When the substrate is highly doped the SiC becomes more absorptive of light energy, especially in the blue-green and near-ultraviolet range light, with a wavelength of about 400–550 nm, which reduces the substrate's efficiency as a light transmitter. A compromise between light output and the forward voltage is therefore unavoidable. Therefore, what is needed is an LED architecture that provides for improved light output.

SUMMARY OF THE INVENTION

An LED consistent with the present invention emits light in about the 400–550 nm range of the light spectrum and is characterized by a high-energy conversion efficiency between the device driving current and output optical energy. The LED has a substrate side including a substantially non-conductive SiC substrate; a nucleating buffer structure disposed on the substrate; an epitaxial layer side comprising an n-type layer, an active region and a p-type layer. The active region can be a double heterostructure (DH), a single quantum well (SQW), or a multiple quantum well (MQW) structure. The n-type and p-type layers can be n-doped and p-doped $Al_xIn_yGa_{1-x-y}N$, $0 \leq x, y \leq 1$. The epitaxial layer side abutting the buffer structure has at least one electrode electrically connected to each of a p-side and an n-side of the LED.

The epitaxial layer side includes a plurality of layers containing GaN and is disposed on an upper surface of the substrate, and the preponderance of light emitted from the LED emerges from through a lower, or light-emitting surface of the substrate.

Because the undoped SiC substrate is highly resistive, the LED consistent with the present invention includes the two necessary electrodes positioned at the same side (i.e., the epitaxial layer side of the LED), and spaced apart from the substrate. Because the current does not need to pass through either the buffer structure or the substrate, the forward voltage is not degraded by the high resistivity of the buffer material or the substrate. Also, since current is not passed through the substrate, it can remain substantially undoped, and the light emission from the substrate side is enhanced without degrading the low biasing voltage. Further, since light generated in the active region exits more readily from the substrate side than from the other faces of the LED chip, a reflector can be formed on the epitaxial layer side so that substantially all light originally propagating toward the epi/epoxy interface is reflected towards the substrate side, and therefore more light is emitted from the LED. The SiC substrate is to be substantially undoped, preferably having a resistivity of at least 0.09 ohm-cm and as such, the substrate is minimally absorptive of output light energy having wavelengths in the range greater than 400 nm.

Additionally, the light-emitting surface of the substrate can be roughened by mechanical processing, improving optical transmission from the substrate into and through the epoxy packaging material into open space.

Light emission is additionally maximized in an LED consistent with the current invention by the placement of the electrodes at the epitaxial layer side of the device.

Other objects and attainments together with a fuller understanding of the invention will become apparent and appreciated by referring to the following description and claims taken in conjunction with the accompanying drawings.

DETAILED DESCRIPTION OF THE INVENTION

Figure 1:
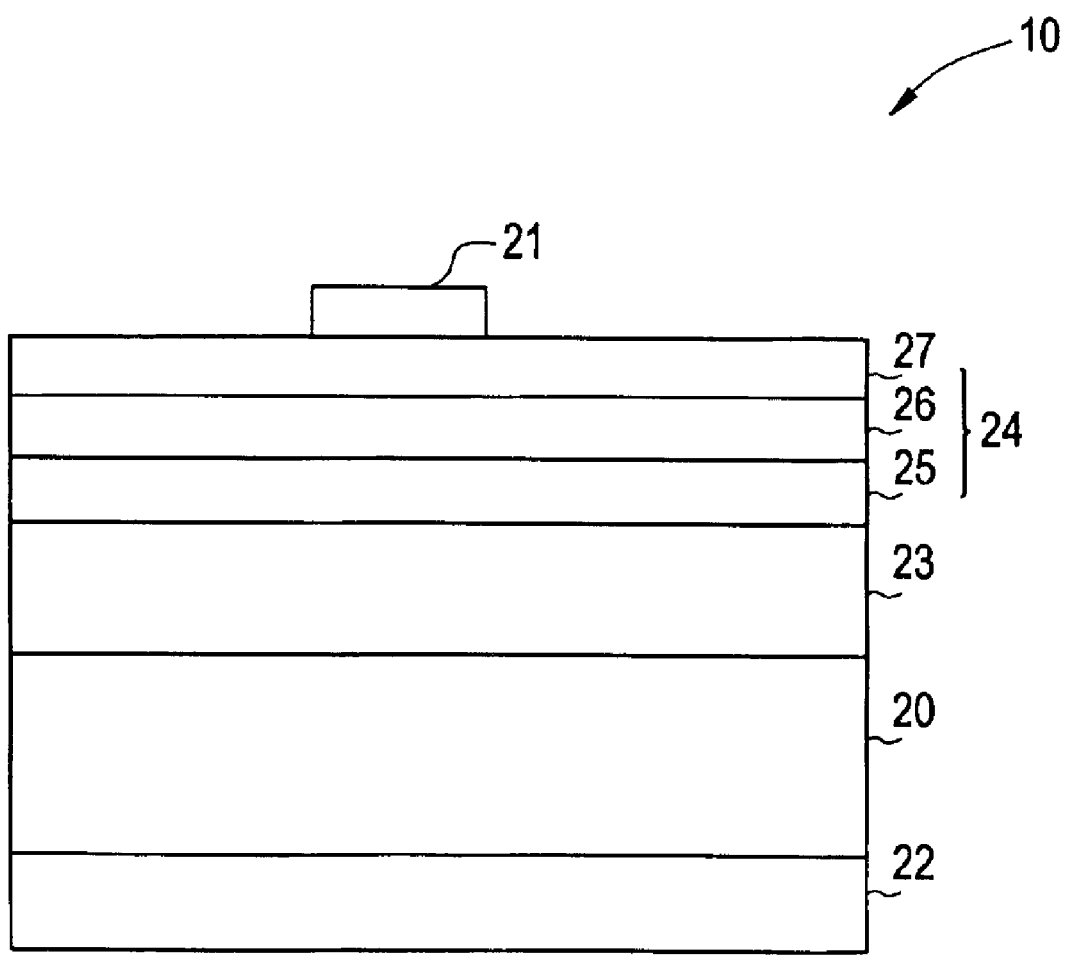
FIG. 1 is a sectional view of a conventional LED.

FIG. 2 depicts a cross-sectional schematic view of one embodiment of an LED consistent with the present invention and generally designated at 100. The LED is constructed on a substrate 101. Preferably, the substrate 101 is undoped and is single crystal SiC having a resistivity of greater than 0.09 ohm-cm. SiC is selected because of its high index of refraction and its close lattice match to gallium nitride (3.5% mismatch) and related III–V nitride compounds. Other substrates known to those skilled in the art to substantially match the characteristics of SiC may be used as well.

The substrate 101 is commonly grown by vapor transfer, a technique well known to those skilled in the art and not discussed further herein. Such substrates may be purchased from Sterling Semiconductor, located at 22660 Executive Drive, Suite 101 Sterling, Va. 20166–9535, or II–VI Inc. located at 375 Saxonburg Blvd., Saxonburg, Pa. 16056. Additional semiconductor layers described in this section are grown using metalorganic chemical vapor deposition (MOCVD), a technique well known in the art and also not discussed further herein. Other well-known growth techniques and processes may be employed as well, to grow the epitaxial layers upon the substrate 101.

The light-emitting diode 100 includes the substrate 101 having a lower or light-emitting surface 130 and an upper surface 132. The LED 100 further includes a nucleating buffer structure 102 having which may abut the substrate 101 and is preferably formed from GaN, AlN, indium nitride (InN), ternary Group III nitrides having the formula $A_xB_{1-x}N$, where A and B are Group III elements and where x is one of zero, one, and a fraction between zero and one, quaternary Group III nitrides having the formula $A_xB_yC_{1-x-y}N$ where A, B, and C are Group III elements, the sum of x and y is one of zero, one, and a fraction between zero and one, and 1 is greater than the sum of x and y, and alloys of SiC with such ternary and quaternary Group III nitrides.

The buffer structure 102 is disposed between the substrate 101 and the light-emitting structure 112 to mitigate the physical stress induced by the crystal lattice mismatch between the two materials. The light emitting diode 100 has a horizontal architecture light-emitting structure 112, and neither the buffer structure 102 nor the substrate 101 is situated between the electrodes 110, 115 disrupting the intended path of the activation current.

Figure 2A:
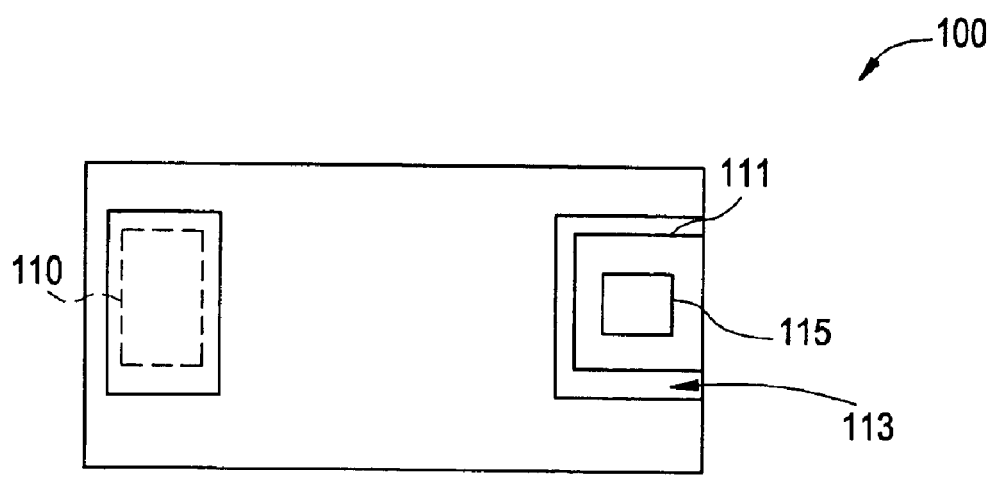
FIG. 2A is a top plan view of an LED consistent with the present invention.
Figure 2B:
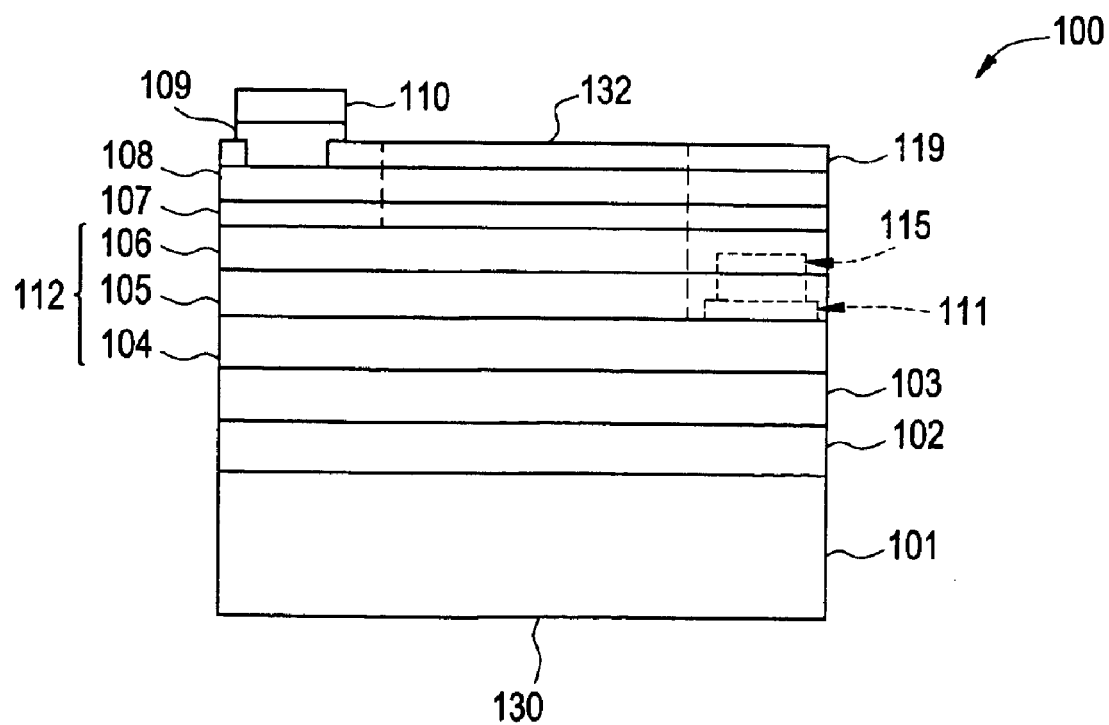
FIG. 2B is a cross-sectional schematic view of the LED of FIG. 2A.

In one embodiment consistent with the present invention as depicted in FIGS. 2A and 2B, the buffer structure 102 includes a single non-conducting nucleation layer, but may include other layers. The layer 102 is formed from AlN, however other materials may be used including AlGaN or other materials known to those skilled in the art. The buffer structure material may be non-conductive as vertical current conduction through the buffer structure 102 is not required. A single layer buffer design reduces manufacturing complexity and improves diode 100 performance by minimizing absorption and internal reflection. Other embodiments consistent with the present invention may employ different or layered nucleation material layers, or other layers, to emphasize different device performance characteristics.

Disposed on the buffer structure 102, is a layer of undoped GaN which may be grown to serve as a GaN substrate 103 in the light-emitting structure 112. The GaN substrate 103 serves to complete the lattice buffer function establishing the GaN crystal lattice and creating a high quality, low defect foundation for the formation of a cladding layer that is disposed on the substrate 103.

A light-emitting structure 112 is formed on the GaN substrate 103, the light-emitting structure 112 being a double heterostructure including a p-n junction in which the active and heterostructure layers are selected from the group of binary Group III nitrides, ternary Group III nitrides, quaternary Group III nitrides, and alloys of SiC with such nitrides.

The light-emitting structure 112 includes a first cladding layer 104, an active region 105, and a second cladding layer 106. The first cladding layer 104 is disposed on the GaN substrate 103. The cladding layers 104, 106 must each be doped to either a different one of a p-type or n-type. The active region 105 is disposed on the first cladding layer 104. The active region 105 preferably has a bandgap smaller than the bandgap of either of the cladding layers 104, 106.

The second cladding layer 106 is disposed on the active region 105. In the illustrative example of FIG. 3, the first cladding layer 104 is preferably formed of silicon doped GaN, the active region 105 is preferably formed from a silicon doped n-type gallium-indium-nitride/gallium nitride (GaInN/GaN) multi quantum well (MQW) structure, and the second cladding layer is preferably formed of Mg doped aluminum gallium nitride (AlGaN).

In one embodiment consistent with the present invention as depicted in FIG. 2B, a first window layer 107 is formed of Mg doped GaN, and a second window layer 108 is formed of another Mg doped GaN layer to permit an ohmic contact between the window layers 107, 108 and a first electrode 110. The second window layer 108 is disposed on the first window layer 107, the first window layer 107 being disposed on the light-emitting region 112.

A semitransparent conductive layer 119 formed of nickel oxide/gold (NiO/Au) is disposed on the second window layer 108 to further spread current from the first electrode 110 over the surface of the window layers 107, 108 to maximize the reach of the drive current and make optimal use of the available active region 105. The upper surface 132 of the semitransparent conductive layer 119 is also the upper surface of the LED 100.

The first electrode 110 is seated upon a reflective bond pad adhesion layer 109 formed on the upper surface of the second window layer 108. The first electrode 110 is deposited on an upper surface of the adhesion pad 109 to facilitate wire bonding in the packaging process. Each of the first cladding layer 106 and the second cladding layer 104 have a bandgap larger than the active region 105.

To provide an ohmic contact to the first cladding layer 104, the window layers 107, 108 and several layers of the light-emitting structure 112 are etched to form an opening 113 through the window layers 107, 108 and the several layers of the light-emitting structure 112 to expose the upper surface of the first cladding layer 104 as shown by the dotted line in FIG. 2B. A reflective bond pad 111 is deposited on the upper surface 150 of the first cladding layer 104, and a conductive contact, such as gold, is deposited on the bond pad 111 to form a second electrode 115.

The lower surface 130 of the substrate 101 can be roughed using a chemical or mechanical process to minimize reflection back into the substrate and LED structure. This promotes light transmission out of the device. Potential roughening techniques include sawing (mechanical), RIE (chemical) and LE4 (chemical).

Because of the very close match of the lattice constants of SiC and GaN related III–V semiconductor compounds, the substrate 101 is preferably formed from SiC. SiC is suited to the construction, high performance and durability requirements, and production efficiency of the GaN LED structure. Minimizing the lattice mismatch between layers in the LED device reduces crystal defects that limit the performance of the device. The use of lateral conduction LED device structure allows for a non-conductive buffer structure 102 and the process of producing it. An LED consistent with the present invention has a power output rating of about at least 1 mW when operating with a driving current of 20 mA.

Light absorption within the substrate 101 consistent with the current invention is minimized, as the SiC substrate is preferably undoped, and having a resistance of at least 0.09 Ohm-cm. The electrodes 110, 115 do not significantly obstruct light emitted from the semiconductor structure as they are on the epitaxial side of the device, opposite the lower surface of the substrate 130, from which the preponderance of emitted light is to escape. A further refinement consistent with the current invention roughens the lower surface of the SiC substrate 130 by a technique known in the art to further improve emission efficiency.

In view of the cumulative effect of these device features and refinements, a light-emitting device of high-energy conversion efficiency is consistent with the present invention.

While the invention has been described in conjunction with several embodiments, it is evident to those skilled in the art that many alternatives, modifications, and variations will be apparent in light of the foregoing description. Accordingly, the invention is intended to embrace all such alternative, modifications, and variations that fall within the spirit and scope of the appended claims.

What is claimed is:

1. A light-emitting diode which emits light in the 400–550 nm portion of a visible spectrum, said light emitting diode comprising:

an undoped SIC substrate;
a nitride nucleating buffer structure disposed on an upper surface of said SiC substrate;
a p-n junction diode heterostructure disposed on said buffer structure, comprising:
  a first cladding layer; and
  a second cladding layer, said first cladding layer and said second cladding layer being comprised of one of binary Group III nitrides and ternary Group III nitrides;
a first window layer formed of Mg doped GaN and disposed on said p-n junction diode heterostructure;
a second window layer formed of Mg doped GaN and disposed on said first window layer;
a conductive layer formed of NiO/Au and disposed on said second window layer, an upper surface of said conductive layer being an upper surface of the light-emitting diode;
a first opening formed at one side of the light emitting diode and through said conductive layer such that a first bond pad is disposed on an upper surface of said second window layer;
a first electrode disposed on said first bond pad;
a second opening formed at another side of the light emitting diode, said second opening forming a three walled notch in said light emitting diode, said second opening being formed through to said first cladding layer on which a second bond pad is disposed; and
a second electrode disposed on said bond pad.

2. The light-emitting diode according to claim 1, wherein said buffer structure is chosen from gallium nitride, indium nitride, ternary Group III nitrides having a formula $A_xB_{1-x}N$ where A and B are Group III elements and where x is one of zero, one, and a fraction between zero and one, quaternary Group III nitrides having a formula $A_xB_yC_{1-x-y}N$, where A, B, and C are Group III elements, x and y are one of zero, one, and a fraction between zero and one, and 1 is greater than a sum of x and y, and alloys of SiC with such ternary and quaternary Group III nitrides.

3. A light-emitting diode which emits light in the 400–550 nm portion of a visible spectrum, said light emitting diode comprising:

an undoped SiC substrate;
a nitride nucleating buffer structure disposed on an upper surface of said SiC substrate;
a p-n junction diode heterostructure disposed on said buffer structure, comprising:
  a first cladding layer; and
  a second cladding layer, said first cladding layer and said second cladding layer being comprised of one of Group III nitrides and ternary Group III nitrides;
a first window layer formed of Mg doped GaN and disposed on said p-n junction diode heterostructure;
a second window layer formed of Mg doped GaN and disposed on said first window layer;
a conductive layer formed of NiO/Au and disposed on said second window layer, an upper surface of said conductive layer being an upper surface of the light-emitting diode;
a first opening formed at one side of the light emitting diode, and through said conductive layer such that a reflective bond pad is disposed on an upper surface of said second window layer;
a first electrode disposed on said bond pad;
a second opening formed at a central position at another side of the light emitting diode, said second opening forming a three walled notch in said light emitting diode, said second opening being formed through to said first cladding layer on which a reflective bond pad is disposed; and
a second electrode disposed on said reflective bond pad;
wherein said p-n junction diode heterostructure comprises a double heterostructure, said double heterostructure further comprising an active layer, said active layer being chosen from binary Group III nitrides, ternary Group III nitrides, quarternary Group nitrides, and alloys of SiC with such nitrides, and said first cladding layer and said second cladding layer being further chosen from quarternary Group III nitrides, and alloys of SiC with such nitrides.

4. The light-emitting diode according to claim 1, wherein said buffer structure comprises a single layer of aluminum nitride.

5. The light-emitting diode according to claim 3, further comprising a gallium nitride epitaxial layer disposed between said buffer structure and said double heterostructure.

6. The light-emitting diode according to claim 1, wherein a power output rating is at least 1 mW when operating with a driving current between said electrodes of 20 milliamps.

7. A light-emitting diode which emits light in the 400–550 nm portion of a visible spectrum, said light emitting diode comprising:
an undoped SiC substrate;
a nitride nucleating buffer structure disposed on an upper surface of said SiC substrate;
a p-n junction diode heterostructure disposed on said buffer structure, comprising:
a first cladding layer; and
a second cladding layer, said first cladding layer and said second cladding layer being comprised of one of binary Group III nitrides and ternary Group III nitrides;
a first window layer formed of Mg doped GaN and disposed on said p-n junction diode heterostructure;
a second window layer formed of Mg doped GaN and disposed on said first window layer;
a conductive layer formed of NiO/Au and disposed on said second window layer, an upper surface of said conductive layer being an upper surface of the light-emitting diode;
a first opening formed at one side of the light emitting diode, and through said conductive layer such that a reflective bond pad is disposed on an upper surface of said second window layer;
a first electrode disposed on said bond pad;
a second opening formed at a central position at another side of the light emitting diode, said second opening forming a three walled notch in said light emitting diode, said second opening being formed through to said first cladding layer on which a reflective bond pad is disposed; and
a second electrode disposed on said reflective bond pad;
wherein said p-n junction diode heterostructure comprises a double heterostructure, said double heterostructure comprising:
an active layer; and
first and second cladding layers disposed adjacent to said active layer, and formed of a composition chosen from gallium nitride, aluminum nitride, indium nitride, ternary Group III nitrides having a formula $A_xB_{1-x}N$ where A and B are Group III elements and where x is one of zero, one, and a fraction between zero and one, and alloys of gallium nitride with such ternary Group III nitrides, quaternary Group III nitrides having a formula $A_xB_yC_{1-x-y}N$, where A, B, and C are Group III elements and where x is one of zero, one, and a fraction between zero and one, y is one of zero, one, and a fraction between zero and one, the sum of x and y is less than one, and alloys of gallium nitride with such quarternary Group III nitrides.

8. The light-emitting diode according to claim 1, wherein said p-n junction diode heterostructure comprises a double heterostructure, said double heterostructure comprising:
an active layer chosen from gallium nitride, aluminum nitride, indium nitride, ternary Group III nitrides having a formula $A_xB_{1-x}N$ where A and B are Group III elements and where x is one of zero, one, and a fraction between zero and one, and alloys of gallium nitride with such ternary Group III nitrides, quaternary Group III nitrides having a formula $A_xB_yC_{1-x-y}N$, where A, B, and C are Group III elements and where x is one of zero, one, and a fraction between zero and one, y is one of zero, one, and a fraction between zero and one, a sum of x and y is less than one, and alloys of gallium nitride with such quarternary Group III nitrides.

9. The light-emitting diode according to claim 7, wherein each of said first and second cladding layers adheres to a formula $Al_xGa_{1-x}N$ where x is one of zero, one, and a fraction between zero and one.

10. The light-emitting diode according to claim 7, wherein each of said first and second cladding layers has a bandgap larger than said active layer.

11. The light-emitting diode according to claim 7, wherein said first cladding layer has an opposite conductivity type from said second cladding layer.

12. The light-emitting diode according to claim 7, wherein said first cladding layer is p-type and said active layer and said second cladding layer are n-type.

13. The light-emitting diode according to claim 7, wherein said first cladding layer is n-type and said active layer and said second cladding layer are p-type.

14. The light-emitting diode according to claim 7, wherein said active layer has a composition $In_xGa_{1-x}N$ where x is a fraction between zero and one.

15. The light-emitting diode according to claim 1, wherein said lower surface of said SiC substrate minimizes reflection back into said SiC substrate and said light-emitting structure.

16. The light-emitting diode according to claim 15, wherein an ohmic contact to said first cladding layer and an ohmic contact to said second cladding layer are each disposed at a side of said epitaxial layer.

17. The light-emitting diode according to claim 1, wherein said first cladding layer is formed of silicon doped gallium nitride.

18. The light-emitting diode according to claim 1, wherein said active layer is formed from a silicon doped n-type gallium indium nitride/gallium nitride multi-quantum well structure.

19. The light-emitting diode according to claim 1, wherein said second cladding layer is formed of magnesium doped aluminum gallium nitride.

20. The light-emitting diode according to claim 1, wherein said second window layer is formed of a relatively more highly doped magnesium gallium nitride than said first window layer.

21. The light-emitting diode according to claim 1, further comprising a reflective bond pad disposed on said first cladding layer.

22. A light-emitting diode which emits light in a 400–550 nm portion of a visible spectrum, said light emitting diode comprising:
a lightly doped SiC substrate and having an epitaxial layer side and a light-emitting side;
a nucleating buffer structure disposed on said substrate at said epitaxial layer side;
wherein said light-emitting side of said SiC substrate is roughened;
a p-n junction diode heterostructure disposed on said buffer structure, said p-n junction diode heterostructure comprising
a first cladding layer; and
a second cladding layer, said first cladding layer and said second cladding layer being comprised of one of binary Group III nitrides, ternary Group III nitrides, and quaternary Group III nitrides;
a first window layer formed of Mg doped GaN and disposed on said p-n junction diode heterostructure;
a second window layer formed of Mg doped GaN and disposed on said first window layer;

a conductive layer formed of NiO/Au and disposed on said second window layer, an upper surface of said conductive layer being an upper surface of the light-emitting diode;

a first opening formed at one side of the light emitting diode, and through said conductive layer such that a reflective bond pad is disposed on an upper surface of said second window layer;

a first electrode disposed on said bond pad;

a second opening formed at a central position at another side of the light emitting diode, said second opening forming a three walled notch in said light emitting diode, said second opening being formed through to said first cladding layer, on which a reflective bond pad is disposed; and a second electrode disposed on said reflective bond pad.

23. The light-emitting diode according to claim 22, wherein said buffer structure is chosen from gallium nitride, indium nitride, ternary Group III nitrides having a formula $A_xB_{1-x}N$ where A and B are Group III elements and where x is one of zero, one, and a fraction between zero and one, quarternary Group III nitrides having a formula $A_xB_yC_{1-x-y}N$, where A, B, and C are Group III elements; x and y are one of zero, one, and a fraction between zero and one, and 1 is greater than a sum of x and y, and alloys of SiC with such ternary and quarternary Group III nitrides.

24. A light-emitting diode which emits light in a 400–550 nm portion of a visible spectrum, said light emitting diode comprising:

a lightly doped SiC substrate having an epitaxial layer side and a light-emitting side;

a nucleating buffer structure disposed on said substrate at said epitaxial layer side;

wherein said light-emitting side of said SiC substrate is roughened;

a p-n junction diode heterostructure disposed on said buffer structure, said p-n junction diode heterostructure comprising a first cladding layer; and a second cladding layer, said first cladding layer and said second cladding layer being comprised of one of binary Group III nitrides, ternary Group III nitrides, and quaternary Group III nitrides;

a first window layer formed of Mg doped GaN and disposed on said p-n junction diode heterostructure;

a second window layer formed of Mg doped GaN and disposed on said first window layer;

a conductive layer formed of NiO/Au and disposed on said second window layer, an upper surface of said conductive layer being an upper surface of the light-emitting diode;

a first opening formed at one side of the light emitting diode, and through said conductive layer such that a reflective bond pad is disposed on an upper surface of said second window layer;

a first electrode disposed on said bond pad;

a second opening formed at a central position at another side of the light emitting diode, said second opening forming a three walled notch in said light emitting diode, said second opening being formed through to said first cladding layer, on which a reflective bond pad is disposed; and a second electrode disposed on said reflective bond pad;

wherein said p-n junction diode heterostructure comprises a double heterostructure, said double heterostructure comprising an active layer chosen from binary Group III nitrides and ternary Group III nitrides and quarternary Group III nitrides, and alloys of SiC with such nitrides, and wherein said first cladding layer and said second cladding layer are further selected from a group consisting of alloys of SiC with such nitrides.

25. The light-emitting diode according to claim 22, wherein said buffer structure comprises aluminum nitride.

26. The light-emitting diode according to claim 22, wherein said p-n junction diode heterostructure comprises a double heterostructure, said double heterostructure comprising:

an active layer; and first and second cladding layers disposed adjacent to said active layer, and formed of a composition chosen from gallium nitride, aluminum nitride, indium nitride, ternary Group III nitrides having a formula $A_xB_{1-x}N$, where A and B are Group III elements and where x is one of zero, one, and a fraction between zero and one, and alloys of gallium nitride with such ternary Group III nitrides, quaternary Group III nitrides having a formula $A_xB_yC_{1-x-y}N$, where A, B, and C are Group III elements and where x is one of zero, one, and a fraction between zero and one, y is one of zero, one, and a fraction between zero and one, the sum of x and y is less than one, and alloys of gallium nitride with such quaternary Group III nitrides.

27. The light-emitting diode according to claim 22, wherein said p-n junction diode heterostructure comprises a double heterostructure, said double heterostructure comprising:

an active layer chosen from gallium nitride, aluminum nitride, indium nitride, ternary Group III nitrides having a formula $A_xB_{1-x}N$ where A and B are Group III elements and where x is one of zero, one, and a fraction between zero and one, and alloys of gallium nitride with such ternary Group III nitrides, quarternary Group III nitrides having a formula $A_xB_yC_{1-x-y}N$, where A, B, and C are Group III elements and where x is one of zero, one, and a fraction between zero and one, y is one of zero, one, and a fraction between zero and one, a sum of x and y is less than one, and alloys of gallium nitride with such quaternary Group III nitrides.

28. The light-emitting diode according to claim 26, wherein each of said first and second cladding layers adheres to a formula $Al_xGa_{1-x}N$, where x is one of zero, one, and a fraction between zero and one.

29. A light-emitting diode which emits light in the 400–550 nm portion of a visible spectrum, said light emitting diode comprising:

an undoped SiC substrate;

a nitride nucleating buffer structure disposed on an upper surface of said SiC substrate;

wherein a lower surface of said SiC substrate is roughened;

a light-emitting structure disposed on said buffer structure and comprising an active layer, a first cladding layer and a second cladding layer, said active layer, said first cladding layer and said second cladding layer being comprised of one of binary Group III nitrides and ternary Group III nitrides;

a first window layer formed of Mg doped GaN and disposed on said p-n junction diode heterostructure;

a second window layer formed of Mg doped GaN and disposed on said first window layer;

a conductive layer formed of NiO/Au and disposed on said second window layer, an upper surface of said conductive layer being an upper surface of the light-emitting diode;

a first opening formed at one side of the light emitting diode and through said conductive layer such that a reflective bond pad is disposed on an upper surface of said second window layer;

a first electrode disposed on said bond pad;

a second opening formed at a central position at another side of the light emitting diode, said second opening forming a three walled notch in said light emitting diode, said second opening being formed through to said first cladding layer, on which a reflective bond pad is disposed; and a second electrode disposed on said reflective bond.

30. A light-emitting diode comprising:

an undoped SiC substrate;

a nucleating buffer structure disposed on one side of said SiC substrate;

wherein another side of said SiC substrate is roughened;

a light-emitting structure disposed on said buffer structure and comprising:
 a first cladding layer;
 an active layer disposed on said first cladding layer; and
 a second cladding layer disposed on said active region;

a first window layer formed of Mg doped GaN and disposed on said light-emitting structure;

a second window layer formed of Mg doped GaN and disposed on said first window layer; and a conductive layer formed of NiO/Au and disposed on said second window layer, an upper surface of said conductive layer being an upper surface of the light-emitting diode;

a first opening formed at one side of the light emitting diode and through said conductive layer such that a first reflective bond pad adhesion layer is disposed on an upper surface of said second window layer, and a first electrode is disposed on said first bond pad; and a second opening formed at a central position at another side of the light emitting diode, said second opening forming a three walled notch in said light emitting diode, said second opening being formed through to said first cladding layer on which a second bond pad is disposed on an upper surface of said first cladding layer.

31. The light-emitting diode according to claim 30, further comprising:
 a layer of undoped GaN disposed on said buffer structure, on which said light-emitting structure is disposed.

32. The light-emitting diode according to claim 30, wherein said buffer structure comprises at least one non-conducting nucleation layer.

33. The light-emitting diode according to claim 32, wherein said buffer structure is formed from GaN, AlN, InN, ternary Group III nitrides having a formula $A_xB_{1-x}N$ where A and B are Group III elements and where x is one of zero, one, and a fraction between zero and one, and alloys of gallium nitride with such ternary Group III nitrides, quarternary Group III nitrides having a formula $A_xB_yC_{1-x-y}N$, where A, B, and C are Group III elements and where x is one of zero, one, and a fraction between zero and one, y is one of zero, one, and a fraction between zero and one, a sum of x and y is less than one, and alloys of SiC with such quaternary Group III nitrides.

34. The light-emitting diode according to claim 30, wherein said light-emitting structure is a double heterostructure including a p-n junction in which active and heterostructure layers are selected from the group of binary Group III nitrides, ternary Group III nitrides, quaternary Group III nitrides, and alloys of SiC with such nitrides.

35. The light-emitting diode according to claim 30, wherein said first cladding layer is formed of silicon doped GaN, said action region is formed from a silicon doped n-type GaInN/GaN MQW structure, and said second cladding layer is formed of Mg doped AlGaN.

36. The light-emitting diode according to claim 30, further comprising a first electrode disposed on said first bond pad adhesion layer.

37. The light-emitting diode according to claim 36, further comprising a second electrode disposed on said second bond pad, said second electrode being formed of Au.

38. The light-emitting diode according to claim 30, wherein each of said first and second cladding layers has a bandgap larger than said active layer.

39. The light-emitting diode according to claim 30, wherein said first cladding layer has an opposite conductivity type from said second cladding layer.

40. The light-emitting diode according to claim 30, wherein said first cladding layer is p-type and said active layer and said second cladding layer are n-type.

41. The light-emitting diode according to claim 30, wherein said first cladding layer is n-type and said active layer and said second cladding layer are p-type.

* * * * *